United States Patent
Park et al.

(10) Patent No.: US 7,304,902 B2
(45) Date of Patent: Dec. 4, 2007

(54) PRE-CHARGE VOLTAGE SUPPLY CIRCUIT OF SEMICONDUCTOR DEVICE

(75) Inventors: Sang Il Park, Icheon-shi (KR); Jong Won Lee, Icheon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/275,162

(22) Filed: Dec. 16, 2005

(65) Prior Publication Data

US 2006/0221738 A1    Oct. 5, 2006

(30) Foreign Application Priority Data

Apr. 1, 2005    (KR) ...................... 10-2005-0027747

(51) Int. Cl.
*G11C 7/00*    (2006.01)
(52) U.S. Cl. ........................ 365/203; 365/202; 365/194
(58) Field of Classification Search ................ 365/203, 365/202, 194
See application file for complete search history.

(56) References Cited

U.S. PATENT DOCUMENTS

| | | | |
|---|---|---|---|
| 4,893,278 A | * | 1/1990 | Ito ............................ 365/203 |
| 5,708,615 A | * | 1/1998 | Ryoho et al. ............... 365/203 |
| 6,339,228 B1 | | 1/2002 | Iyer et al. |
| 6,589,834 B1 | | 7/2003 | Reddy et al. |
| 6,608,768 B2 | | 8/2003 | Sula |
| 6,724,649 B1 | | 4/2004 | Ye et al. |
| 6,801,465 B2 | | 10/2004 | Somasekhar et al. |
| 6,862,239 B1 | | 3/2005 | Huang et al. |
| 2004/0076059 A1 | | 4/2004 | Khellah et al. |
| 2004/0228183 A1 | | 11/2004 | Ito |

FOREIGN PATENT DOCUMENTS

JP    2002208445    7/2002

* cited by examiner

*Primary Examiner*—Huan Hoang
(74) *Attorney, Agent, or Firm*—Marshall, Gerstein & Borun LLP

(57) ABSTRACT

A pre-charge voltage supply circuit of a semiconductor device is disclosed which includes a first switch which supplies a pre-charge voltage in response to a first signal having a predetermined voltage level, and has a turn-on resistance of a predetermined level, and a second switch which is connected in parallel to the first switch, supplies the pre-charge voltage in response to a second signal, and has a turn-on resistance lower than the turn-on resistance of the first switch.

13 Claims, 5 Drawing Sheets

PRE-CHARGE VOLTAGE SUPPLY CIRCUIT OF SEMICONDUCTOR DEVICE

FIELD OF THE INVENTION

The present invention relates to a pre-charge voltage supply circuit of a semiconductor device, and, more particularly, to a pre-charge voltage supply circuit of a semiconductor device which is capable of reducing the amount of current leaked through the region where a bridge is formed between a bit line and a word line in association with a particular cell in the semiconductor device, in a standby mode, and rapidly supplying a pre-charge voltage to the bit line and a complementary bit line in a pre-charge mode, thereby achieving an increase in pre-charge speed.

DESCRIPTION OF THE RELATED ART

Recently-developed, highly integrated semiconductor devices have a reduced element area. In particular, in the case of a dynamic random access memory (DRAM) device, there is an increased possibility of a phenomenon where a bridge is formed between a bit line and a word line in the process of manufacturing the semiconductor device due to a reduction in the pitch of gates in the semiconductor device. The formation of the bridge between the word line and the bit line is mainly caused by a gate residue, namely, poly-silicon remaining without being completely removed after etching of a poly-silicon film to form a gate, or undesirable removal of a nitride film on the gate during a chemical mechanical polishing (CMP) process, and thus, weakness of the corresponding region.

FIG. 1 is a sectional view illustrating formation of a bridge between a word line and a bit line in a semiconductor device. As shown in FIG. 1, when a bridge is formed between a word line and a bit line, a current path is established between the word line and the bit line. As a result, charges in the bit line flow along the current path in a standby mode of the semiconductor device. Thus, undesirable current leakage is generated between the word line and the bit line in the standby mode. Of course, it may be possible to prevent erroneous operations caused by formation of a bridge by substituting the failed cell, in which the bridge is formed, by a redundant cell. In this case, however, the failed cell still remains in the semiconductor device, so that leakage current still flows through the failed cell.

FIG. 2 is a graph depicting an amount of leakage current generated due to generation of errors in rows/columns caused by a bridge generated between a word line and a bit line. Referring to FIG. 2, it can be seen that the amount of leakage current is increased depending on the number of fail rows/columns caused by failed cells. The leakage current unnecessarily consumed per failed cell is about 9 µA which corresponds to 7 to 10% of the limit value specified in the Standard Specification for standby current in low-power semiconductor devices. Increase in leakage current caused by a bridge formed between a word line and a bit line adversely affects the current characteristics of the semiconductor device. Thus, such a leakage current increase serves as a rain factor to degrade the throughput of the semiconductor device.

Of course, in order to reduce leakage current caused by failed cells in a semiconductor device, a method of adding a high resistance component to a pre-charge voltage supply circuit in the semiconductor device to achieve a reduction in leakage current may be conceived. However, although this method may reduce leakage current, it also inhibits rapid transfer of the pre-charge voltage to bit lines due to the high resistance component, so that degradation in pre-charge characteristics occurs.

SUMMARY OF THE INVENTION

A pre-charge voltage supply circuit of a semiconductor device is capable of reducing the amount of current leaked through a region where a bridge is formed between a bit line and a word line in association with a particular cell in the semiconductor device, in a standby mode, and rapidly supplying a pre-charge voltage to the bit line and a complementary bit line in a pre-charge mode, thereby achieving an increase in pre-charge speed.

A pre-charge voltage supply circuit of a semiconductor device may include a first switch which supplies a pre-charge voltage in response to a first signal having a predetermined voltage level, and has a turn-on resistance of a predetermined level, and a second switch which is connected in parallel to the first switch. The second switch supplies the pre-charge voltage in response to a second signal, and has a turn-on resistance lower than the turn-on resistance of the first switch.

The first switch and the second switch may be commonly connected to a pre-charge voltage supply node, and may supply the pre-charge voltage to a bit line and a complementary bit line.

The second switch may be turned on at the point of time not later than the point of time when a pre-charge mode is initiated, and may be turned off at the point of time when a first predetermined period elapses from the turn-on of the second switch The pre-charge voltage supply circuit may further comprise a switching controller which receives a third signal enabled in response to an active command and disabled in response to a pre-charge command, and outputs the third signal, as the second signal, after delaying the third signal for the first predetermined period.

The third signal may be a bank active signal.

The second switch may be an n-channel metal oxide semiconductor (NMOS) transistor which operates in response to the second signal.

Alternatively, the second switch may be turned on at the point of time when a first predetermined period elapses from an initiation of an active mode, and is turned off at the point of time when a second predetermined period elapses from an initiation of a pre-charge mode.

The pre-charge voltage supply circuit may further include a switching controller that receives a third signal enabled in response to an active command and disabled in response to a pre-charge command The switching controller outputs the third signal, as the second signal, after delaying the third signal for the second predetermined period.

The third signal may be a bank active signal.

The second switch may be an n-channel metal oxide semiconductor (NMOS) transistor which operates in response to the second signal.

The first switch may be maintained in an ON state irrespective of an operation mode of the semiconductor device. Alternatively, the first switch may be turned on when the semiconductor device is in a pre-charge mode and in a standby mode.

The first switch may be an n-channel metal oxide semiconductor (NMOS) transistor which operates in response to the first signal, the first signal having a high voltage level.

The first switch may be maintained in an ON state irrespective of an operation mode of the semiconductor device, and the second switch may be turned on at the point of time not later than the point of time when a pre-charge mode is initiated, and is turned off at the point of time when a first predetermined period elapses from the turn-on of the second switch.

The second signal may be a signal obtained by delaying, for the fist predetermined period, a third signal enabled in response to an active command and disabled in response to a pre-charge command.

The third signal may be a bank active signal.

The pre-charge voltage supply circuit may further comprise a third switch and a fourth switch which are turned on in a pre-charge mode and a standby mode, to supply the pre-charge voltage to a bit line and a complementary bit line.

The third switch and the fourth switch may be turned on in response to a third signal disabled during an active mode, to isolate the bit line and the complementary bit line from each other during the active mode.

BRIEF DESCRIPTION OF THE DRAWINGS

Features and advantages of the present invention will become more apparent after reading the following detailed description when taken in conjunction with the drawings, in which.

DETAILED DESCRIPTION

Hereinafter, the present invention will be described in detail, in conjunction with exemplary embodiments. These embodiments are used only for illustrative purposes, and the present invention is not limited thereto.

Figure 1:
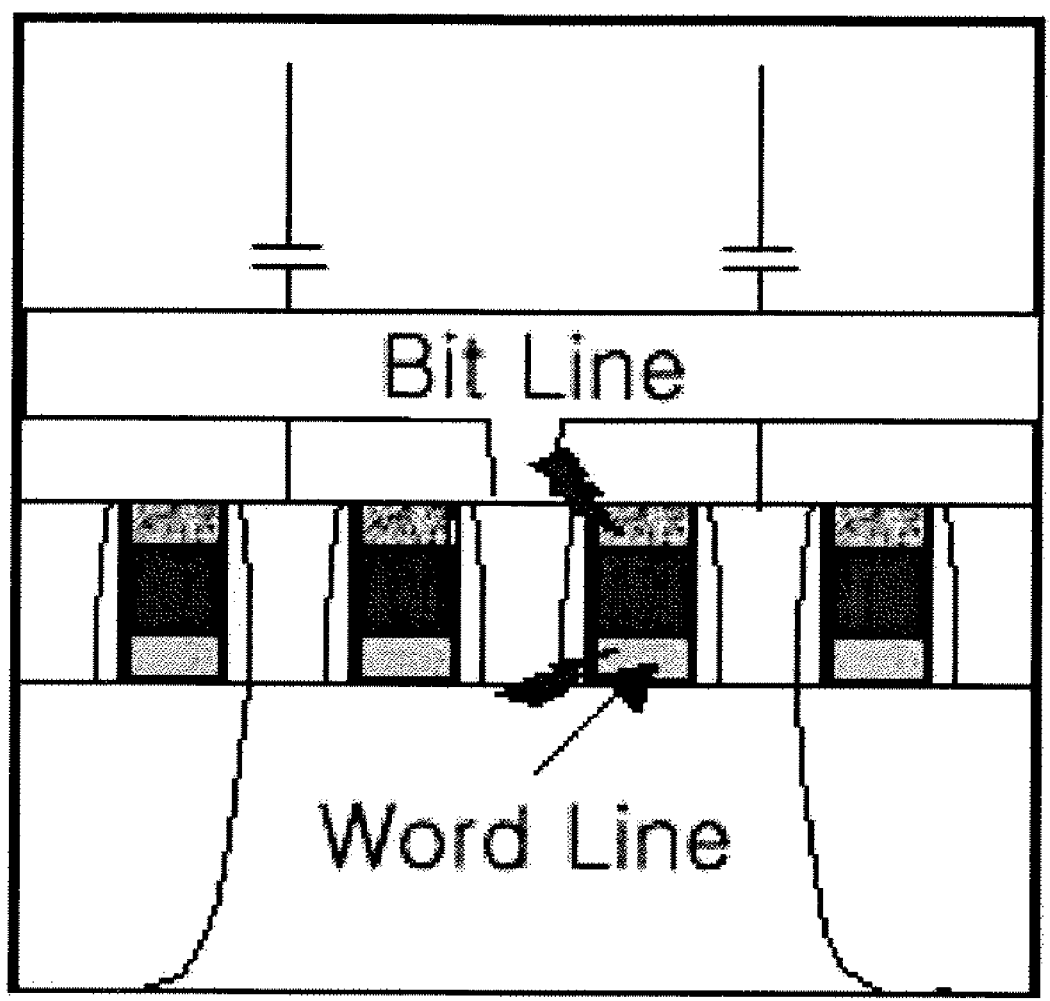
FIG. 1 is a sectional view illustrating formation of a bridge between a word line and a bit line in a semiconductor device.
Figure 2:
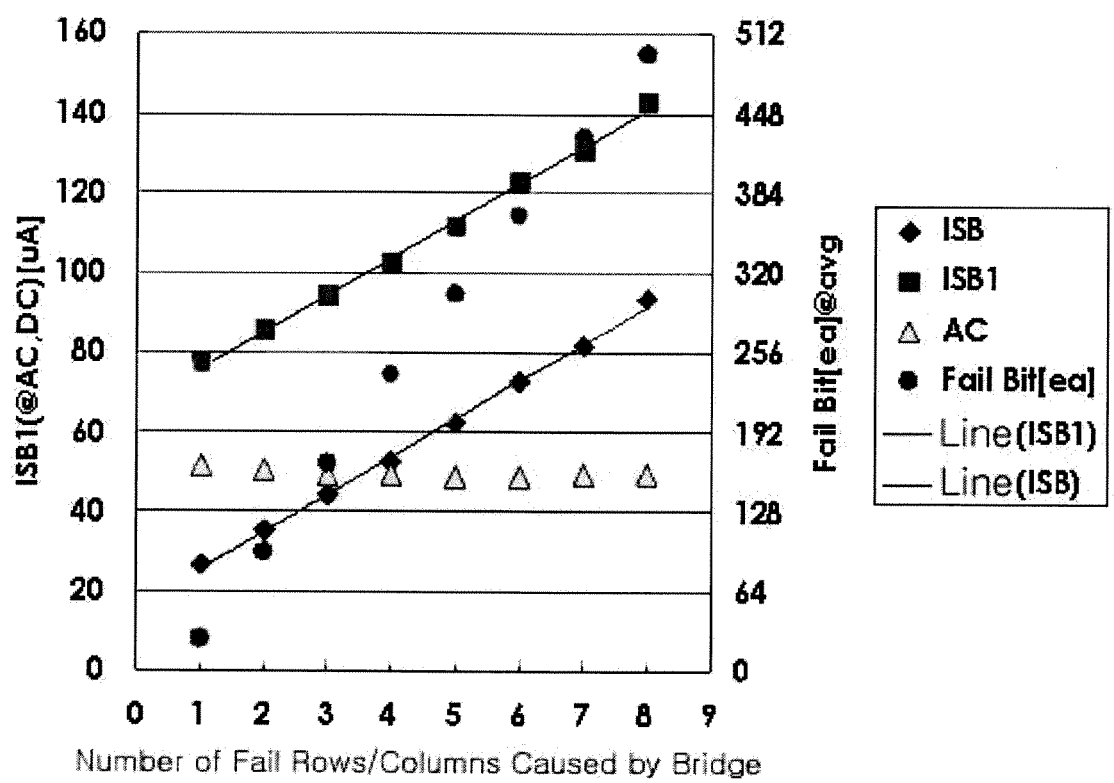
FIG. 2 is a graph depicting an amount of leakage current generated due to generation of errors in rows/columns caused by a bridge generated between a word line and a bit line.
Figure 3:
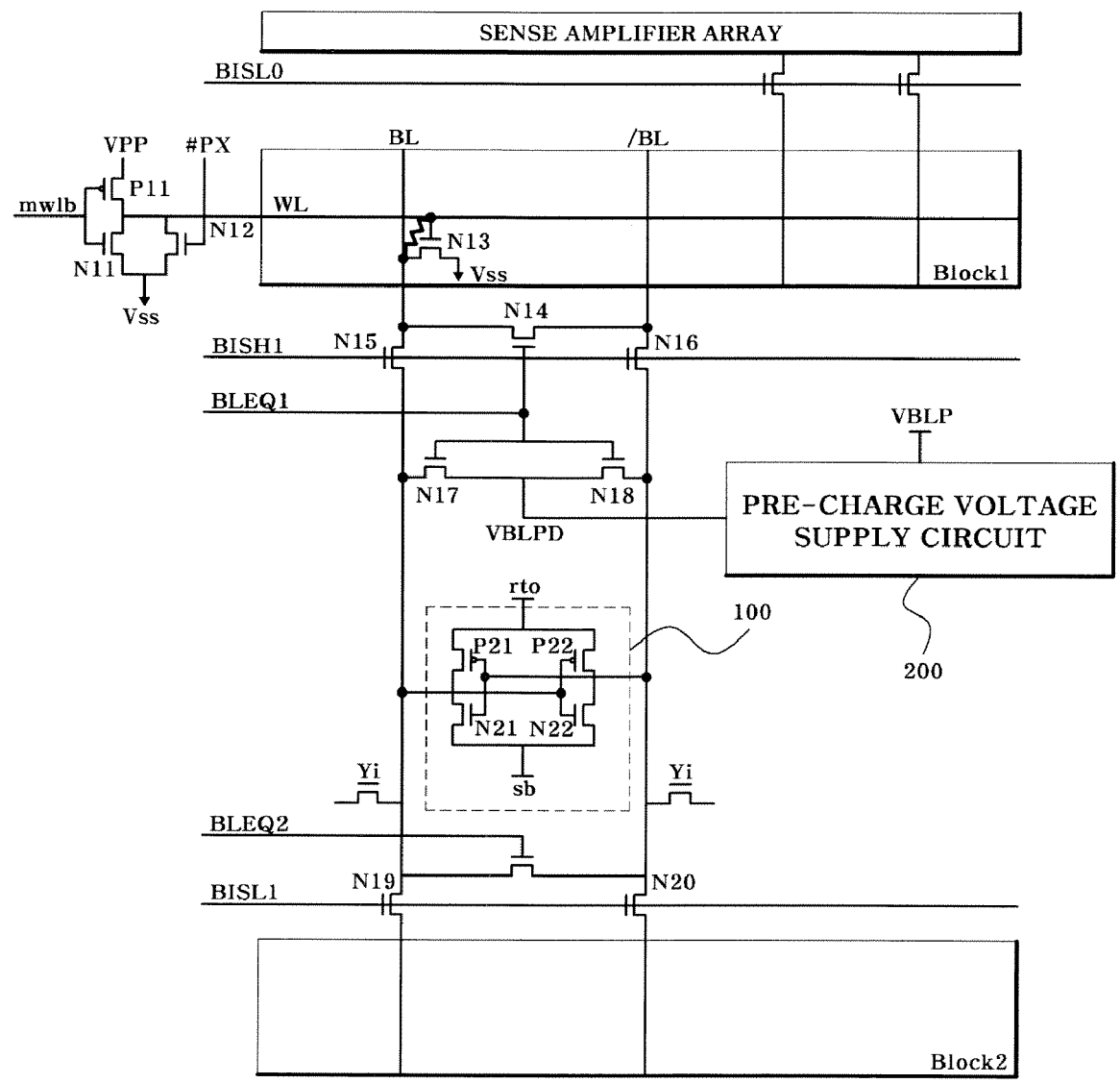
FIG. 3 is a circuit diagram illustrating a structure of a memory cell region in a semiconductor device according to a herein described embodiment.
Figure 4:
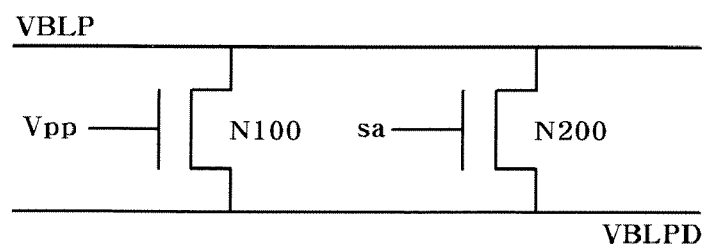
FIG. 4 is a circuit diagram illustrating a configuration of a pre-charge voltage supply circuit to a herein described embodiment.

As shown in FIGS. 3 and 4, a pre-charge voltage supply circuit 200 of a semiconductor device may include an n-channel metal oxide semiconductor (NMOS) transistor N100 which supplies a pre-charge voltage VBLP in response to a first signal VPP having a high voltage level, and has a turn-on resistance of a predetermined level, and an NMOS transistor N200 which is connected in parallel to the NMOS N100, supplies the pre-charge voltage VBLP in response to a second signal sa, and has a turn-on resistance lower than that of the NMOS N100. The pre-charge voltage supply circuit 200 may also include a switching controller 300 which receives a third signal ba disabled in response to input of an active command and enabled in response to input of a pre-charge command, and outputs the second signal sa after delaying the second signal sa for a predetermined time tD.

As shown in FIG. 3, the pre-charge voltage supply circuit 200 may further include NMOS transistors N17 and N18 which are turned on in a pre-charge mode and a standby mode, respectively, and supply the pre-charge voltage VBLP to a bit line BL and a complementary bit line /BL, respectively.

Operation of the pre-charge voltage supply circuit having the above-described configuration will be described in detail with reference to FIGS. 3 to 7. The following description will be given in association with respective operation modes of the semiconductor device, namely, an active mode, a pre-charge mode, and a standby mode. For purposes of this discussion the following may apply: "active mode" means an operation mode in which active operations such as the input and output of data are executed, "pre-charge mode" means an operation mode in which bit lines and complementary bit lines are pre-charged to a predetermined voltage, in particular, a voltage corresponding to ½ of a core voltage VCORE, after completion of the active mode, and "standby mode" means a low power consumption mode in which the semiconductor device is in a standby state to reduce power consumption after completion of the pre-charge mode.

Figure 7:
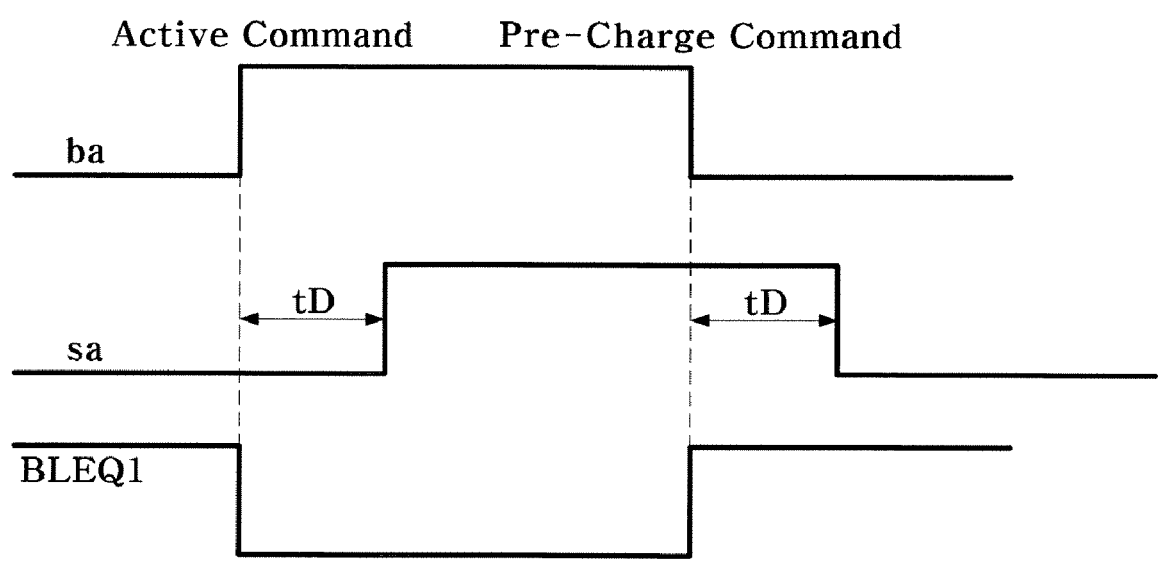
FIG. 7 is a timing diagram of a switching control signal output from the switching controller.

First, operation in the active mode will be described When the semiconductor device is switched to the active mode, transition of a signal mwlb from a high level to a low level is carried out. Also, transition of a signal #PX to a low level is also carried out. Accordingly, in the circuit of FIG. 3, p-channel MOS (PMOS) tnsistor P11 is turned on, whereas NMOS transistors N11 and N12 are turned off. As a result the word line WL in a block block1 is driven at the voltage level of the first signal VPP which is a high voltage level. Also, transition of a signal BLEQ1 from a high level to a low level is carried out, as shown in FIG. 7. As a result, NMOS transistors N14, N17, and N18 are turned off, so that bit line BL and complementary bit line /BL are isolated from each other.

On the other hand, NMOS transistors N15 and N16 are turned on because the signal BISH1 is maintained at a high level. Also, NMOS transistors N19 and N20 are turned off because the signal BISL1 is transited to a low level. As a result a sense amplifier 100 senses and amplifies data from an NMOS transistor N13, which is a cell tnsistor. The sense amplifier 100 may also input data to the cell transistor N13.

Next operation in the pre-charge mode will be described. When the semiconductor device enters the pre-charge mode after completion of the active mode, the signal mwlb is transited from a low level to a high level. Also, the signal #PX is transited from a low level to a high level. Accordingly, the PMOS transistor P11 is turned off, whereas the NMOS transistors N11 and N12 are turned on. As a result, the word line WL in the block block1 is driven at a ground level VSS. Also, the signal BLEQ1 is transited from a low level to a high level, as shown in FIG. 7. As a result, the NMOS transistors N14, N17, and N18 are turned on, so that the bit line BL and complementary bit line /BL are pre-charged with a voltage VBLPD supplied from the pre-charge voltage supply circuit 200. In this state, the signal BISH1 is maintained at a high level, and the signal BISL1 is transited to a high level, thereby turning on the NMOS transistors N19 and N20. Thus, a pre-charge operation is normally performed for the bit line BL and complementary bit line /BL.

The operation of the pre-charge voltage supply circuit 200 will be described in more detail with reference to FIG. 4. As shown in FIG. 4, a pre-charge voltage VBLP is supplied to the bit line BL and complementary bit line /BL in accordance with operations of the NMOS transistors N100 and N200. In the illustrated embodiment the NMOS transistor N100 is designed to have a high resistance in an ON state, namely, a high turn-on resistance, and thus, to operate in response to a high voltage VPP, and to be maintained in the ON state irrespective of the operation mode of the semiconductor device. Accordingly, the NMOS transistor N100 is already in an ON state at the point of time when the semiconductor device enters the pre-charge mode.

Figure 6:
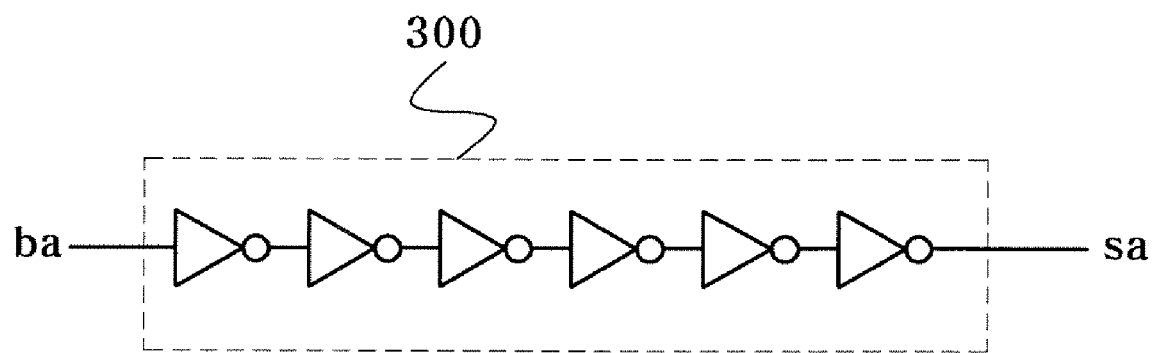
FIG. 6 is a circuit diagram illustrating a configuration of a switching controller for controlling a second switch included in a pre-charge voltage supply circuit.

On the other hand, the NMOS transistor N200 is designed to have a turn-on resistance much lower than that of the NMOS transistor N100, and thus, to operate in response to the second signal sa output from the switching controller 300, and to be maintained in the ON state for at least a predetermined time tD after the initiation of the pre-charge mode. As shown in FIG. 6, the second signal sa is a control signal for controlling the switching controller 300 to delay the third signal ba which is a bank active signal. The bank active signal ba is enabled in response to input of an active command, and is disabled in response to the input of a pre-charge command, so as to activate an associated bank. Thus, the control signal sa is enabled when the predetermined time tD elapses from the input of the active command, and is disabled when the predetermined time tD elapses from the input of the pre-charge command. Accordingly, the NMOS transistor N200 is maintained in an ON state for a period for which the control signal sa is maintained in an enable state. Therefore, the NMOS transistor N200 can supply the pre-charge voltage VBLP at the point of time when the semiconductor device enters the pre-charge mode because the NMOS transistor N200 has already been in an ON state.

Figure 5:
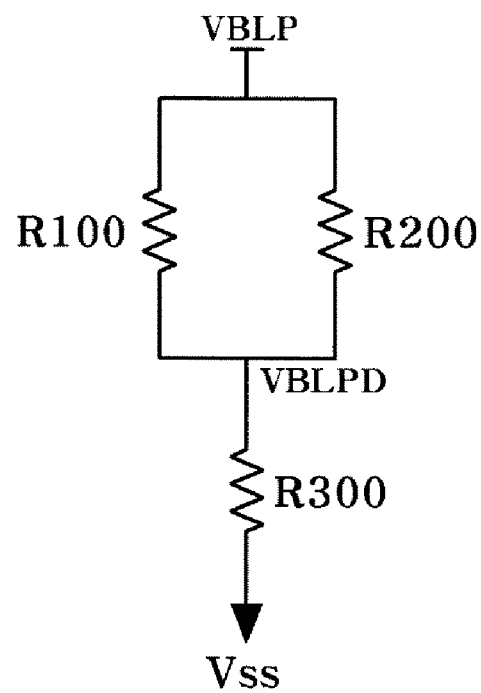
FIG. 5 is an circuit diagram illustrating a circuit formed by the pre-charge voltage supply circuit according to another described embodiment and a bridge-formed region.

In brief, the NMOS transistors N100 and N200 have already been in an ON state at the point of time when the semiconductor device enters the pre-charge mode, so that they supply the pre-charge voltage VBLP to the bit line BL and complementary bit line /BL, simultaneously with the transition of the signal BLEQ1 from a low level to a high level. Thus, it is possible to rapidly supply the pre-charge voltage VBLP, and thus, to achieve an enhance in pre-charge speed in accordance with the illustrated embodiment That is, in the illustrated embodiment, in addition to the NMOS transistor N100, the NMOS transistor N200, which has a low turn-on resistance, has already been turned on at the point of time when the pre-charge mode is initiated, to enable the pre-charge voltage VBLP to be rapidly supplied to the bit line pair, namely, the bit lines BL and /BL, through the NMOS transistor N200. Referring to FIG. 5 which is an equivalent circuit diagram of the above circuit, the pre-charge voltage VBLP is rapidly supplied to the bit lines BL and /BL through resistance R200 of the NMOS transistor N200 having a low resistance at the point of time when the pre-charge mode is initiated. In this case, accordingly, there is no degradation in pre-charge characteristics caused by a reduction in pre-charge speed, as in conventional cases.

Next, operation in the standby mode will be described. When the semiconductor device enters the standby mode after completion of the pre-charge mode, the signal mwlb is maintained in a high level state, and the signal #PX is maintained in a high level state. Accordingly, the word line WL is maintained in a state of being driven at the ground level VSS. In this state, the signal BLEQ1 is also maintained in a high level state, as shown in FIG. 7, so that the voltage VBLPD from the pre-charge voltage supply circuit 200 is continuously supplied to the bit line BL and complementary bit line /BL.

Meanwhile, if the cell including the NMOS transistor N13 is a failed cell in which a bridge, depicted by the zig-zag line, has been formed between the associated word line WL and the associated bit line BL, as shown in FIG. 3, leakage current flowing from the bit line BL to the word line WL is generated. That is, a current path is established between the bit line BL pre-charged with the pre-charge voltage VBLP and the word line WL maintained at the ground level VSS, due to the bridge. As a result the leakage current flows from the bit line BL to the word line WL, as shown in FIG. 3.

In accordance with the illustrated embodiment, however, although such leakage current is generated, it is possible to control the generation of leakage current such that the amount of leakage current is minimized. That is, in accordance with the illustrated embodiment, the control signal sa is transited to a low level, namely, a disabled state, when the predetermined time tD elapses from the initiation of the pre-charge mode. As a result, the NMOS transistor N200 is turned off in the standby mode. However, the NMOS transistor N100 is maintained in an ON state in the standby mode. In the standby mode, accordingly, the pre-charge voltage VBLP is supplied to the bit line BL only through the NMOS transistor N100 which has a very high turn-on resistance. Therefore, even when a bridge is formed in the NMOS transistor N13, so that a current path is established between the associated bit line BL and the associated word line WL, the amount of leakage current consumed through the current path is greatly reduced. Referring to the equivalent circuit diagram of FIG. 5, in the standby mode, leakage current flows through an equivalent resistance R100 of the NMOS transistor N100 having a very high resistance, and an equivalent resistance R300 caused by the bridge. Accordingly, the amount of leakage current is greatly reduced by virtue of the function of the equivalent resistance R100.

As described above, in accordance with the illustrated embodiment, the NMOS transistor N200 having a low turn-on resistance has already been in an ON state at the point of time when the pre-charge mode is initiated, together with the NMOS transistor N100 having a high turn-on resistance, and the ON state of the NMOS transistor N200 is maintained for a predetermined delay time tD, so as to rapidly supply the pre-charge voltage VBLP to the bit line pair. Accordingly, it is possible to achieve an enhancement in pre-charge speed. Also, in the standby mode, only the NMOS transistor N100 having a high turn-on resistance is maintained in an ON state. Accordingly, even when a bridge is formed in the NMOS transistor N13, so that a current path is established between the associated bit line BL and the associated word line WL, the amount of leakage current consumed through the current path is greatly reduced.

In the illustrated embodiment, the switching controller 300 includes an even number of inverters to constitute a delay circuit for delaying the bank active signal ba for the predetermined time tD, as shown in FIG. 6. However, the present invention is not limited to this configuration. Meanwhile, the control signal sa output from the switching controller 300 is adapted to ensure that the NMOS transistor N200 is maintained in an ON state for the predetermined time tD after the input of the pre-charge command. Accordingly, the point of time to enable the control signal sa in the active mode period, as shown in FIG. 7, can be optionally set in accordance with the given system condition. Also, although the NMOS transistor N100 has been described as being maintained in an ON state irrespective of the operation mode of the semiconductor device in the illustrated embodiment, it may be possible to maintain the NMOS transistor N100 in an ON state for a period from the pre-charge mode to the standby mode, if necessary.

As apparent from the above description, a pre-charge voltage supply circuit of a semiconductor device may be constructed to have switch elements having turn-on resistances greatly different from each other are connected in parallel, so as to supply a pre-charge voltage along different paths in accordance with different operation modes, respectively. Accordingly, it is possible to reduce the amount of current leaked through a region where a bridge is formed between a bit line and a word line in association with a particular cell in the semiconductor device, in a standby mode, and to rapidly supply the pre-charge voltage to the bit line and a complementary bit line in a pre-charge mode, thereby achieving an increase in pre-charge speed.

Although the various embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A pre-charge voltage supply circuit of a semiconductor device comprising:
   a first switch that supplies a pre-charge voltage in response to a first signal having a predetermined voltage level, and has a turn-on resistance of a predetermined level; and
   a second switch which is connected in parallel to the first switch, supplies the pre-charge voltage in response to a second signal, and has a turn-on resistance lower than the turn-on resistance of the first switch;
   a switching controller that receives a third signal enabled in response to an active command and disabled in response to a pre-charge command, and outputs the third signal, as the second signal, after delaying the third signal for the first predetermined period; and
   a third switch and a fourth switch, which are turned on in a pre-charge mode and a standby mode, to supply the pre-charge voltage to a bit line and a complementary bit line, wherein the third switch and the fourth switch operate in response to a fourth signal disabled during an active mode, to isolate the bit line and the complementary bit line from each other during the active mode.

2. The pre-charge voltage supply circuit according to claim 1, wherein the first switch and the second switch are commonly connected to a pre-charge voltage supply node, and supply the pre-charge voltage to a bit line and a complementary bit line.

3. The pre-charge voltage supply circuit according to claim 1, wherein the second switch is turned on at the point of time not later than the point of time when a pre-charge mode is initiated, and is turned off following a first predetermined period from the turn-on of the second switch.

4. The pre-charge voltage supply circuit according to claim 3, wherein the third signal is a bank active signal.

5. The pre-charge voltage supply circuit according to claim 3, wherein the second switch is an n-channel metal oxide semiconductor (NMOS) transistor which operates in response to the second signal.

6. The pre-charge voltage supply circuit according to claim 1, wherein the second switch is turned on following a first predetermined period from an initiation of an active mode, and is turned off when a second predetermined period elapses from an initiation of a pre-charge mode.

7. The pre-charge voltage supply circuit according to claim 1, wherein the first switch is maintained in an ON state irrespective of an operation mode of the semiconductor device.

8. The pre-charge voltage supply circuit according to claim 7, wherein the first switch is an n-channel metal oxide semiconductor (NMOS) transistor which operates in response to the first signal, the first signal having a high voltage level.

9. The pre-charge voltage supply circuit according to claim 1, wherein the first switch is turned on when the semiconductor device is in a pre-charge mode or in a standby mode.

10. The pre-charge voltage supply circuit according to claim 9, wherein the first switch is an n-channel metal oxide semiconductor (NMOS) transistor which operates in response to the first signal, the first signal having a high voltage level.

11. The pre-charge voltage supply circuit according to claim 1, wherein:
   the first switch is maintained in an ON state irrespective of an operation mode of the semiconductor device, and
   the second switch is turned on at the point of time not later than the point of time when a pre-charge mode is initiated, and is turned off when a first predetermined period elapses from the turn-on of the second switch.

12. The pre-charge voltage supply circuit according to claim 11, wherein the second signal is a signal obtained by delaying, for the first predetermined period, a third signal enabled in response to an active command and disabled in response to a pre-charge command.

13. The pre-charge voltage supply circuit according to claim 12, wherein the third signal is a bank active signal.

* * * * *

UNITED STATES PATENT AND TRADEMARK OFFICE
CERTIFICATE OF CORRECTION

| | | |
|---|---|---|
| PATENT NO. | : 7,304,902 B2 | Page 1 of 1 |
| APPLICATION NO. | : 11/275162 | |
| DATED | : December 4, 2007 | |
| INVENTOR(S) | : Sang Il Park et al. | |

It is certified that error appears in the above-identified patent and that said Letters Patent is hereby corrected as shown below:

In the Claims:

At Column 8, line 37, "device," should be -- device; --.

Signed and Sealed this

First Day of July, 2008

JON W. DUDAS
*Director of the United States Patent and Trademark Office*